(12) United States Patent
Chu

(10) Patent No.: US 6,531,969 B2
(45) Date of Patent: Mar. 11, 2003

(54) RESAMPLING SYSTEM AND APPARATUS

(75) Inventor: Ke-Chiang Chu, Saratoga, CA (US)

(73) Assignee: Portalplayer, Inc., Santa Clara, CA (US)

( * ) Notice: Subject to any disclaimer, the term of this patent is extended or adjusted under 35 U.S.C. 154(b) by 0 days.

(21) Appl. No.: 09/847,920

(22) Filed: May 2, 2001

(65) Prior Publication Data

US 2002/0184277 A1 Dec. 5, 2002

(51) Int. Cl.$^7$ ................................................. H03M 7/00
(52) U.S. Cl. ............................................ 341/61; 708/313
(58) Field of Search .............................. 341/61; 708/313

(56) References Cited

U.S. PATENT DOCUMENTS

| | | | | |
|---|---|---|---|---|
| 4,725,972 A | * | 2/1988 | Gockler ........................ 364/724 |
| 4,817,025 A | * | 3/1989 | Asai et al. ................... 708/301 |
| 5,331,346 A | * | 7/1994 | Shields et al. ................. 341/61 |
| 5,398,029 A | * | 3/1995 | Toyama et al. ................ 341/61 |
| 5,446,398 A | * | 8/1995 | Iwata .......................... 327/113 |
| 5,613,084 A | * | 3/1997 | Hau et al. ...................... 341/61 |
| 5,621,404 A | * | 4/1997 | Heiss et al. ................... 341/61 |
| 6,134,268 A | * | 10/2000 | McCoy ....................... 375/229 |
| 6,134,569 A | * | 10/2000 | Kot ............................... 708/3 |
| 6,135,268 A | * | 10/2000 | McCoy ....................... 375/229 |
| 6,137,349 A | * | 10/2000 | Menkhoff et al. ........... 327/552 |
| 6,356,569 B1 | * | 3/2002 | Sonalkar et al. ............ 370/210 |

* cited by examiner

Primary Examiner—Michael Tokar
Assistant Examiner—Khai M. Nguyen
(74) Attorney, Agent, or Firm—Gray Cary Ware & Freidenrich LLP

(57) ABSTRACT

A filter system and method are provided that is particular applicable to the resampling of a signal, such as a digital audio signal. The filtering method in accordance with the invention may use a nearest neighbor strategy to reduce the complexity and cost of the filter without reducing the precision of the resampling.

19 Claims, 2 Drawing Sheets

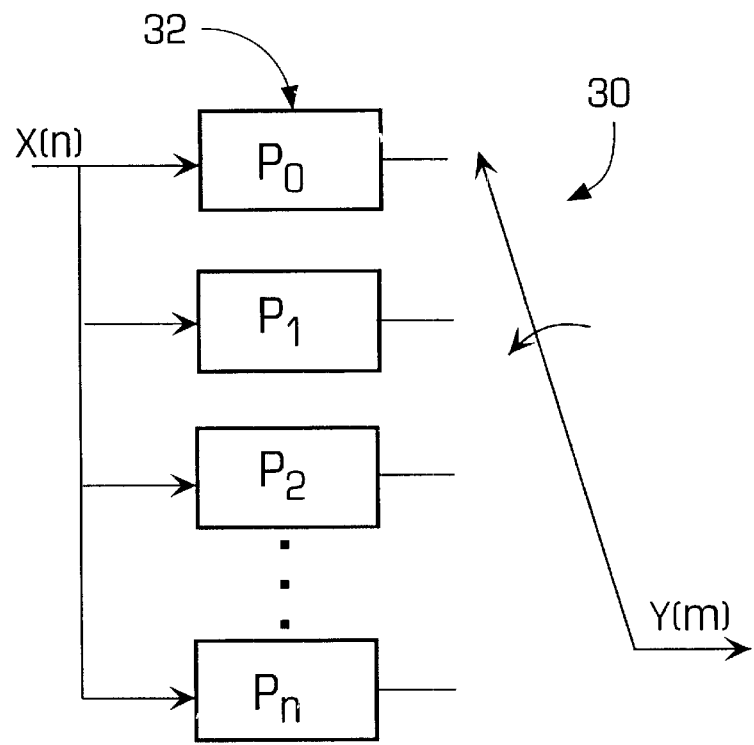
FIG. 4
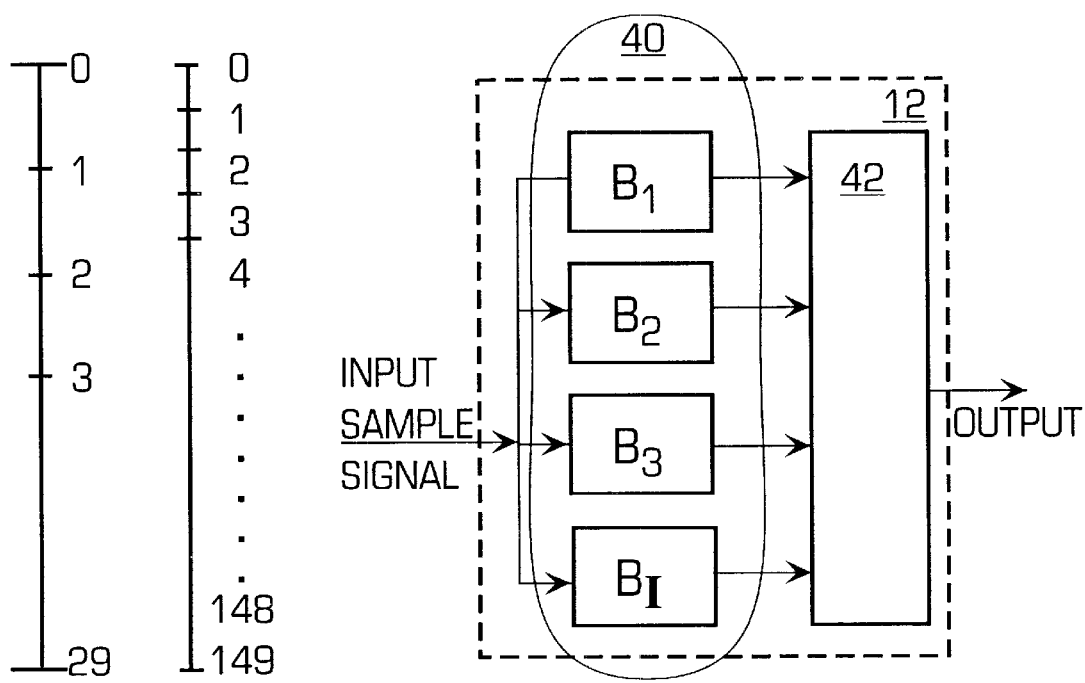
FIG. 5
FIG. 6

RESAMPLING SYSTEM AND APPARATUS

BACKGROUND OF THE INVENTION

This invention relates generally to a system and method for filtering a signal and in particular to a system and method for filtering a digital signal and changing its sampling rate from a first rate to a second different rate which is a process known as resampling.

When an analog signal, such as music or the like, is converted into a digital signal, it is sampled at some predetermined rate known as the sampling rate. The sampling rate can vary, but it is typically set at a particular value for a particular application. The sampling rate used for a particular application typically depends on the Nyquist theorem. The Nyquist theorem states that if you have a signal with a bandwidth of A kHz, then you need (2A×1000) samples so that data is not lost in the conversion from analog to digital. For example, a voice signal may be sampled at 8 kHz, CD quality music (which has a bandwidth from 0 kHz to 20 kHz) may be sampled at 44.1 kHz and a digital audio tape may be sampled at 48 kHz. A typical high quality FM signal may be sampled at 32 kHz.

In many applications, it is desirable to have the output sample rate be different from the input sample rate. The process of altering the data sample rate is called "resampling". For example, a person may listen to a CD with music on it that is typically sampled at 44.1 kHz and then want to play the song as high quality FM signals which requires the digital data to be resampled from 44.1 kHz to 32 kHz.

The algorithm that performs this resampling process is called a "multirate filter" and is a process by which a mathematical equation is applied to the original signal in order to generate the new sample rate signal. Multirate filters are used for resampling but also for anti-aliasing. There are many different ways of implementing the multirate filter. With the classical tapped-delay-line FIR filter design approach, the multirate filter implementation usually results in a very long filter length. Consequently, the implementation is expensive and has an undesirably long filter delay. Most of the time it is unrealistic to realize a multirate filter with this approach because it is too expensive and too slow.

For a resampling operation in which one is converting between a first integer value and a second integer value that are mathematically related to each other by an integer, the resampling process is relatively straight-forward. For example, to convert between 4000 samples per second and 8000 samples per second, a 2:1 filter is used that doubles the sampling rate. However, for a resampling operation in which the two different sampling rates are not related to each other by an integer value (e.g., 2), the resampling process is much more complex and can be handled in one or more different manners.

First, the resampling from an initial lower sampling rate to a higher final sampling rate can be completed by up converting the initial sampling rate to an integer value that is higher than the final sampling rate, but is a least common multiplier of both the initial sampling rate and the final sampling rate. Then, the up converted signal is down converted back to the desired final sampling rate. For example, to convert from a 44.1 kHz CD signal to a 48 kHz DAT signal, the signal is first upconverted by an integer value (e.g., 160) to a first value (7056 kHz) and then down converted by another integer value (e.g., 147) to the desired 48 kHz sampling rate. The problem is that the typical tapped delay-line filter for this resampling has as many as 3000 delays so that the resampling process is very slow and computationally expensive.

One technique to accomplish this is a multirate filter that can be realized by using a cascade of several simple multirate subfilters as is well known. Each subfilter performs a segment of the resampling process. As an example, an 18:1 multirate filter can be realized by two 3:1 multirate filter followed by a 2:1 multirate filter. The cascade filter approach is often selected to lower the total computational burden of the resampling and to lower the required data storage. However for small integer resampling, the benefits of cascade filters are small and the overhead of operating separate subfilters may overcome the small gains.

The other approach is to partition the multirate filter into collection of subfilters to generate a well known polyphase filter. With the polyphase filter, the subset of filter coefficients needed to compute a given output point are those that intersect the nonzero data points in the span of the filter's total impulse response. With this approach the computation are effectively reduced since the total delay associated with the polyphase filter is much less than the typical cascade filter. However, a large number of subfilters are needed to achieve a specified distortion requirement.

Another conventional technique is to interpolate the polyphase filter results. For example, one can compute the approximation to the desired output by interpolation using the following equation:

$$y(m) = (1-\alpha_m)y_1(m) + \alpha_m y_2(m)$$

However, this technique is still to computationally intensive for many applications. Thus, it is desirable to provide a filter system that overcomes the above limitations and problems with resampling and it is to this end that the present invention is directed.

SUMMARY OF THE INVENTION

The resampling system and apparatus in accordance with the invention achieves and provides a cost-effective and computationally efficient resampling process. In the preferred embodiment, the resampling process achieves the resampling from a 44.1 kHz digitally sampled signal on a CD into a 32.kHz digitally sampled signal that may be stored digitally in a memory of a portable music device or stored in some other persistent storage medium. To achieve the computationally efficient resampling, the filter system may use a predetermined range of sub-filters (e.g., 22–24 in the preferred embodiment) in a polyphase filter so that the typical interpolation that is typically necessary for a polyphase filter is avoided. In more detail, the number of sub-filters is chosen such that a nearest neighbor strategy is used in which, for each sample point, the sample point is assigned to its closest neighbor which eliminates the interpolation and reduces the computation by a factor of two without sacrificing the output quality of the output resampled signal.

Thus, in accordance with the invention, a computer implemented resampling filter is provided. The resampling filter has a polyphase filter having between 20 and 25 sub-filter elements so that a desired output sample is adjacent to a sample from the sub-filter elements, and a nearest neighbor determiner for selecting whether a desired output sample from the resampled signal is assigned to a first resampled sample or to a second resampled signal.

In accordance with another aspect of the invention, a resampling filter for converting from a 44100 samples per second signal to a 32000 samples per second signal is provided having similar elements. In accordance with another aspect of the invention, a computer implemented resampling method comprises selecting a desired sample, y(m) according to the following equations $$y(m)=y_2(m) \text{ if } \alpha_m \geq 1-\epsilon \text{ or}$$

$$y(m)=y_1(m) \text{ if } \alpha_m < \epsilon$$

wherein $y_1(m)$ is a first sample, $y_2(m)$ is a second sample, $\alpha_m=(I)(t_m)$, $\epsilon$ is the error, I is the number of filters in the polyphase filter and $t_m$ is the time that the first sample lags the desired sample.

BRIEF DESCRIPTION OF THE DRAWINGS

FIG. 4 is a diagram illustrating a polyphase filter that may implement the resampling process in accordance with the invention;

FIG. 5 is a diagram illustrating the samples of a typical 150 element long polyphase filter and the corresponding samples of the resampling filter in accordance with the invention; and FIG. 6 is a block diagram illustrating a preferred embodiment of the computer-implemented resampling filter in accordance with the invention.

DETAILED DESCRIPTION OF A PREFERRED EMBODIMENT

The invention is particularly applicable to a resampling filter for resampling an input signal with an initial sampling rate of 44.1 kHz to an output signal with a sampling rate of 32 kHz that may be used to resample music data and it is in this context that the invention will be described. It will be appreciated, however, that the resampling filter in accordance with the invention has greater utility, such as to being used to resample any digital signal from any first sampling rate to any second sampling rate.

Figure 1:
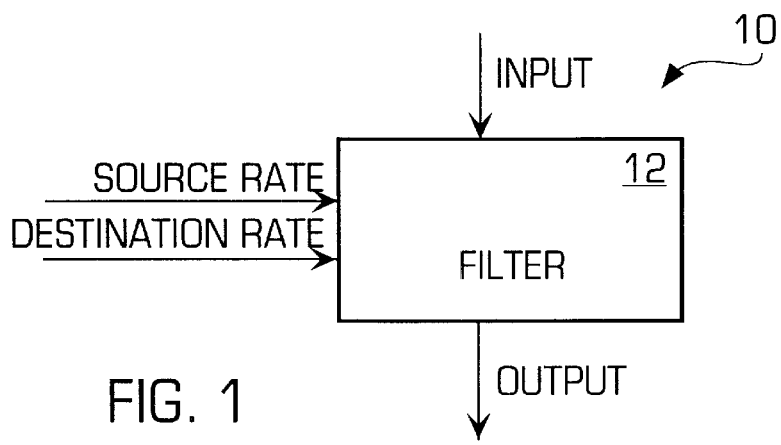
FIG. 1 is a diagram illustrating a resampling apparatus in accordance with the invention.

FIG. 1 is a diagram illustrating a resampling apparatus 10 in accordance with the invention. In particular, the resampling apparatus may include a filter 12 that may be implemented using a piece of hardware, such as a digital signal processor or floating point unit, wherein the hardware executes a series of instructions, such as microcode instructions, to calculate a mathematical equation corresponding to the filter function necessary to convert from a first sampling rate to a second sampling rate. As shown, a source rate (the initial sampling rate of the input signal) and a destination rate (the final sampling rate of the output signal) may be input into the filter 12. In addition, an input signal is fed into the filter 12 and an output signal is generated. In operation, the input digital signal that has been sampled at the source rate is resampled at the destination rate so that the output signal is also a digital signal that is sampled at the destination rate as is well known.

Figure 2:
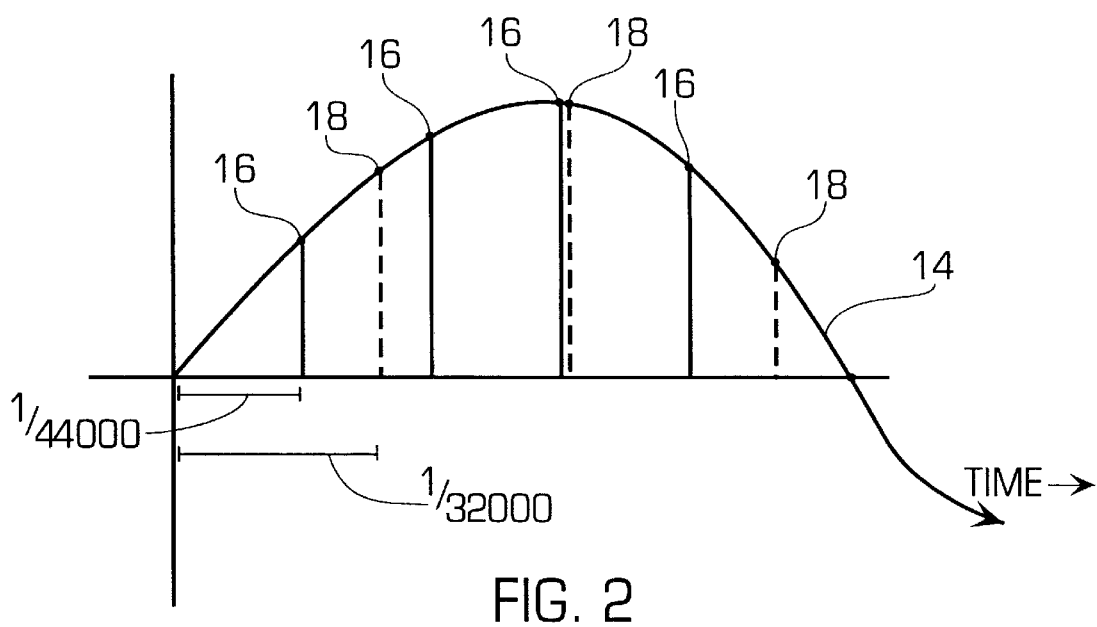
FIG. 2 is a diagram illustrating a preferred embodiment of the resampling process wherein a signal sampled at 44.1 kHz is resampled at 32 kHz.

FIG. 2 is a diagram illustrating a preferred embodiment of the resampling process wherein a signal sampled at 44.1 kHz is resampled at 32 kHz. In particular, a signal 14 is shown that has been digitally sampled by a well known A/D converter so that the analog signal can be stored in digital format. Initially, the signal is sampled at a 44.1 kHz sampling rate (44100 samples per second) wherein one or more samples 16 of the signal are shown as solid vertical lines. As is well known, each sample period is $1/44100$ seconds as shown. Using the filter in accordance with the invention, the signal is resampled at 32 kHz wherein one or more samples 18 at the new sampling rate are shown as dotted vertical lines. Due to the resampling, the actual value of each sample at the different sampling rates is sometimes different and sometimes the same. Thus, during the resampling process, it is possible to degrade the quality of the signal due to the sampling error introduced during the resampling process. Now, a typical filter implementation that can be used for the resampling will be described.

Figure 3:
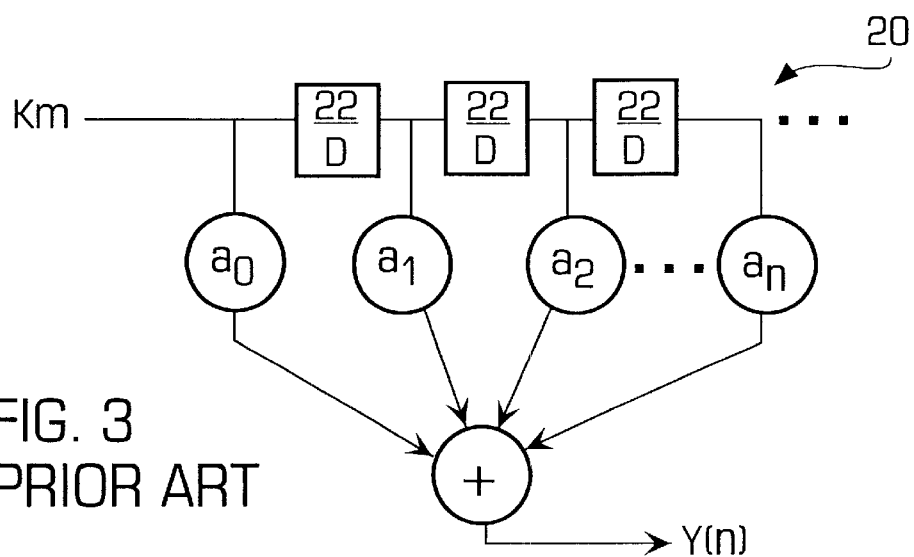
FIG. 3 is a diagram illustrating a conventional tapped delay line FIR filter that may be used for resampling.

FIG. 3 is a diagram illustrating a conventional tapped delay line FIR filter 20 that may be used for resampling but has many limitations that make it a poor choice for performing the resampling process. In particular, an input signal $(K_m)$ is fed into the filter and the filter generates an output signal $(Y_n)$ with the new sampling rate. To implement the resampling process, the filter may have one or more delay elements 22 wherein the signal after each delay element may be weighted and added together. In more detail, the original signal is multiplied by a constant $(a_0)$ to generate a first intermediate result, the first delayed signal is multiplied by a second constant $(a_1)$ to generate a second intermediate result and so on until the last delayed signal is multiplied by a last constant $(a_n)$. Then, the intermediate results are added together to achieve the output signal. The problem with this approach is that the filter length for the resampling process is typically more than 3000 delays long. Thus, the filter is very slow and very expensive to implement for the conversion of a 44.1 kHz signal into a 32 kHz signal. To overcome the problems with this approach and increase the speed of the filter, a polyphase approach may be used.

FIG. 4 is a diagram illustrating a polyphase filter 30 that may implement the resampling process in accordance with the invention. In particular, the length of the delay path is shortened in that the input signal is fed into one or more sub-filter banks 32 ($P_0$, $P_1$, $P_2$, . . . , $P_n$) wherein the appropriate sub-filter bank is chosen in order to produce the appropriate output signal. In general, polyphase filters are well known. The advantage of the polyphase filter is that the length of each delay line is significantly reduced. As an example, a typical polyphase filter that is used to resampling a digital signal may have 150 sub-filter banks wherein each sub-filter bank has 20 delays. Thus, the delay associated with the resampling has been reduced by a factor of 150. This polyphase filter has better response time, but the delay associated with the polyphase filter can be further reduced and the computational complexity reduced so that the resampling process can be implemented in an embedded type system that requires a faster response time and less computational complexity since the embedded system has less processing power.

To reduce the limitations of polyphase filters, the polyphase filter technique may be extended. In particular, the number of polyphase sub-filters may be reduced to a predetermined number, I. When only I sub-filters are used, a desired sampling time may fall between two adjacent samples, $y_1(m)$ and $y_2(m)$, but the desired sampling time must be computed. Assuming the sampling time of the first sample lags the desired sampling time by $t_m$, the sampling time for the second sample is then leading the desired sampling time by $(1/I)-t_m$. Using these values, we can compute the approximation of the desired output by interpolation according to the following equation:

$$y(m)=(1-\alpha_m)y_1(m)+\alpha_m y_2(m)$$

where $\alpha_m = It_m$ and $0 \leq \alpha_m \leq 1$. With this approach, computation storage is further reduced, but an interpolation is necessary. Unfortunately, this approach is still too expensive for some cases, such as embedded applications.

Therefore, in accordance with the invention, the number of sub-filters, I, is carefully selected through experimentation such that either $\alpha_m = 1-\epsilon$, or $\alpha_m = \epsilon$ with a threshold $\epsilon \approx 0$. By implementing a "nearest neighborhood strategy" in accordance with the invention along with the carefully selected value of I, the desired sample is either set equal to the first sample or the second sample. In other words, the desired sample in accordance with the invention is determined according to the following equations:

$$y(m)=y_2(m) \text{ if } \alpha_m \geq 1-\epsilon$$

$$y(m)=y_1(m) \text{ if } \alpha_m < \epsilon$$

Thus, using the carefully selected value of I (determined through experimentation) and the nearest neighbor strategy, the resampling process is further reduced by another factor of 2 without sacrificing output quality which was also tested.

FIG. 5 is a diagram illustrating the samples of a typical 150 element long polyphase filter and the corresponding samples of the resampling filter in accordance with the invention wherein the number of sub-filters is chosen to be I=24. As shown, the number of sub-filters is chosen so that, for most of the new samples, the sample can be set to one of the old values with a minimal error. In practice, the overall complexity of the resampling filter is reduced. but the sound quality of the output signal is not degraded since $\epsilon$ is always very small and therefore the interpolation is not needed.

FIG. 6 illustrates a preferred embodiment of the resampling filter 12 in accordance with the invention. The resampling filter may include one or more sub-filter banks 40 ($B_1$, $B_2$, $B_3$, $B_I$) into which the input signal is fed and a nearest neighbor determiner 42 into which the signals from the filter banks are fed. The output of the nearest neighbor determiner 42 is the desired output sample. In the preferred embodiment, the resampling filter (including the sub-filters and the nearest neighbor determiner) is implemented as a plurality of lines of instructions/microcode that are executed by a processing unit, such as a digital signal processor, a typical microprocessor or the like. An example of the pseudocode that may be used to implement the resampling filter in accordance with the invention is shown below.

---
Resampling PseudoCode
---
Refill the encoding buffer;
merge new data with leftover;
while (outputSize < frameSize)
{
    s = Index[TargetSubFilter];
    Calculate e = epilson;
    if (e>0.9)
        s++
    else if (e > 0.1)
        print (warning signal, e);
    Get FilterCoef[s];

---
-continued

Resampling PseudoCode
---
    output = Convolve (Input, filter[s]);
    update timing control;
    outputSize++;
}

Through experimentation, it was determined that the number of sub-filter banks was between 21 and 25 and more preferably between 22 and 24. In detail, the invention was developed at the conceptual level and then the desirable number of filters was determined by experimentation. During the experiment, the filter was set up with various different numbers of filters and the desirable number of filter was determined based on filter performance. In particular, the filter performance is good when the output sound quality is not degraded. Thus, when the number of filters was set between 22 and 24, the following results were achieved that indicated good filter performance. First, the output signal produced by the filter had the correct number of samples every second (e.g., for every 441 samples in the original signal, the output signal had 320 evenly spaced samples for the preferred embodiment of resampling from 44.1 kHz to 32 kHz). Second, the output sound quality had negligible quality degradation. Third, the error, $\epsilon$, is always very small (e.g., $\epsilon < 0.1$ in the preferred embodiment).

While the foregoing has been with reference to a particular embodiment of the invention, it will be appreciated by those skilled in the art that changes in this embodiment may be made without departing from the principles and spirit of the invention, the scope of which is defined by the appended claims.

What is claimed is:

1. A computer implemented resampling filter providing a resampled signal, comprising:

a polyphase filter having between 20 and 25 sub-filter elements so that a desired output sample is adjacent to a sample from the sub-filter elements; and a nearest neighborhood determiner for selecting whether a desired output sample for the resampled signal is selected from a first resampled sample or from a second resampled signal from the polyphase filter in order to minimize the error introduced by the nearest neighborhood determiner.

2. The filter of claim 1, wherein the error introduced by the nearest neighbor determiner is less than 0.1.

3. The filter of claim 1, wherein the polyphase filter further comprises between 22 and 24 sub-filter elements.

4. The filter of claim 3, wherein the polyphase filter further comprises 24 sub-filter elements.

5. The filter of claim 4, wherein the nearest neighbor determiner further comprises means for selecting a desired sample, y(m) according to the following equations $$y(m)=y_2(m) \text{ if } \alpha_m \geq 1-\epsilon \text{ or}$$

$$y(m)=y_1(m) \text{ if } \alpha_m < \epsilon$$

wherein $y_1(m)$ is a first sample, $y_2(m)$ is a second sample, $\alpha_m = (I)(t_m)$, $\epsilon$ is the error, I is the number of filters in the polyphase filter and $t_m$ is the time that the first sample lags the desired sample.

6. A resampling filter for converting from a 44100 samples per second signal to a 32000 samples per second resampled signal comprising a polyphase filter having between 20 and 25 sub-filter elements so that a desired output sample is adjacent to a sample from the sub-filter elements; and a nearest neighborhood determiner for selecting whether a desired output sample for the resampled signal is selected from a first resampled sample or from a second resampled signal from the polyphase filter in order to minimize the error introduced by the nearest neighborhood determiner.

7. The filter of claim 6, wherein the error introduced by the nearest neighbor determiner is less than 0.1.

8. The filter of claim 6, wherein the polyphase filter further comprises between 22 and 24 sub-filter elements.

9. The filter of claim 8, wherein the polyphase filter further comprises 24 sub-filter elements.

10. The filter of claim 9, wherein the nearest neighbor determiner further comprises means for selecting a desired sample, y(m) according to the following equations $$y(m)=y_2(m) \text{ if } \alpha_m \geq 1-\epsilon \text{ or}$$

$$y(m)=y_1(m) \text{ if } \alpha_m < \epsilon$$

wherein $y_1(m)$ is a first sample, $y_2(m)$ is a second sample, $\alpha_m=(I)(t_m)$, $\epsilon$ is the error, I is the number of filters in the polyphase filter and $t_m$ is the time that the first sample lags the desired sample.

11. A computer implemented resampling method comprising selecting a desired sample, y(m) according to the following equations $$y(m)=y_2(m) \text{ if } \alpha_m \geq 1-\epsilon \text{ or}$$

$$y(m)=y_1(m) \text{ if } \alpha_m < \epsilon$$

wherein $y_1(m)$ is a first sample, $y_2(m)$ is a second sample, $\alpha_m=(I)(t_m)$, $\epsilon$ is the error, I is the number of filters in the polyphase filter and $t_m$ is the time that the first sample lags the desired sample.

12. The method of claim 11, wherein $\epsilon<0.1$.

13. A computer implemented resampling filter, comprising:

a polyphase filter having between 20 and 25 sub-filter elements, wherein each of the sub-filter elements receives an input sample and generates an output sample; and a nearest neighborhood determiner for selecting a desired output sample from the sub-filter elements output samples wherein the desired output sample is selected from a first output sample from a particular sub-filter element or from a second output sample from an adjacent sub-filter element.

14. The filter of claim 13, wherein the error introduced by the nearest neighbor determiner is less than 0.1.

15. The filter of claim 13 wherein the polyphase filter further comprises between 22 and 24 sub-filter elements.

16. The filter of claim 15, wherein the polyphase filter further comprises 24 sub-filter elements.

17. The filter of claim 16, wherein the nearest neighbor determiner further comprises means for selecting a desired sample, y(m) according to the following equations $$y(m)=y_2(m) \text{ if } \alpha_m \geq 1-\epsilon \text{ or}$$

$$y(m)=y_1(m) \text{ if } \alpha_m < \epsilon$$

wherein $y_1(m)$ is a first sample, $y_2(m)$ is a second sample, $\alpha_m=(I)(t_m)$, $\epsilon$ is the error, I is the number of filters in the polyphase filter and $t_m$ is the time that the first sample lags the desired sample.

18. A method for resampling an input sample, comprising the steps of:

providing the input sample to one or more sub-filter elements, wherein each sub-filter element generates an output sample, to generate a set of output samples; and selecting an output sample from the set of output samples adjacent to a desired output sample in order to minimize the sampling error.

19. The method of claim 18, wherein the selection further comprises selecting a desired sample, y(m) according to the following equations $$y(m)=y_2(m) \text{ if } \alpha_m \geq 1-\epsilon \text{ or}$$

$$y(m)=y_1(m) \text{ if } \alpha_m < \epsilon$$

wherein $y_1(m)$ is a first sample, $y_2(m)$ is a second sample, $\alpha_m=(I)(t_m)$, $\epsilon$ is the error, I is the number of filters in the polyphase filter and $t_m$ is the time that the first sample lags the desired sample.

* * * * *